United States Patent
Takeda

(10) Patent No.: US 10,506,751 B2
(45) Date of Patent: Dec. 10, 2019

(54) BOARD WORK MANAGEMENT DEVICE

(71) Applicant: FUJI CORPORATION, Chiryu-shi (JP)

(72) Inventor: Masahiro Takeda, Chiryu (JP)

(73) Assignee: FUJI CORPORATION, Chiryu-shi (JP)

( * ) Notice: Subject to any disclaimer, the term of this patent is extended or adjusted under 35 U.S.C. 154(b) by 264 days.

(21) Appl. No.: 15/535,211

(22) PCT Filed: Dec. 22, 2014

(86) PCT No.: PCT/JP2014/083957
§ 371 (c)(1),
(2) Date: Jun. 12, 2017

(87) PCT Pub. No.: WO2016/103330
PCT Pub. Date: Jun. 30, 2016

(65) Prior Publication Data
US 2017/0347507 A1    Nov. 30, 2017

(51) Int. Cl.
*H05K 13/04* (2006.01)
*G05B 19/42* (2006.01)
(Continued)

(52) U.S. Cl.
CPC ....... *H05K 13/0495* (2013.01); *G05B 19/418* (2013.01); *G05B 19/42* (2013.01);
(Continued)

(58) Field of Classification Search
CPC ........... H05K 13/0495; H05K 13/0882; H05K 13/08; G05B 19/42; G05B 19/418; G05B 2219/45031
See application file for complete search history.

(56) References Cited

U.S. PATENT DOCUMENTS 4,163,183 A * 7/1979 Engelberger .......... B23P 21/002
318/568.13
5,189,624 A * 2/1993 Barlow ................ G05B 19/182
700/169
(Continued)

FOREIGN PATENT DOCUMENTS

EP     2 717 666 A1    4/2014
JP    2004-165521 A    6/2004
(Continued)

OTHER PUBLICATIONS

International Search Report dated Feb. 3, 2015, in PCT/JP2014/083957 filed Dec. 22, 2014.
(Continued)

*Primary Examiner* — Naum Levin
(74) *Attorney, Agent, or Firm* — Oblon, McClelland, Maier & Neustadt, L.L.P.

(57) ABSTRACT

A board work management device includes a board work quantity reset switch; a board work quantity counting section that counts each board on which, from among the multiple board work machines, at least one board work machine has performed work, for each of the at least one board work machines; a board work quantity memory section that memorizes the board work quantity of the board work machine counted by the board work quantity counting section; and a board work quantity resetting section that, when the board work quantity reset switch is operated, resets the board work quantity of a specified board work machine among the at least one board work machines memorized by the board work quantity memory section while the multiple board work machines are operating.

3 Claims, 6 Drawing Sheets

(51) Int. Cl.
*G05B 19/418* (2006.01)
*H05K 13/08* (2006.01)

(52) U.S. Cl.
CPC ......... *H05K 13/08* (2013.01); *H05K 13/0882* (2018.08); *G05B 2219/45031* (2013.01)

(56) References Cited

U.S. PATENT DOCUMENTS

| | | | | |
|---|---|---|---|---|
| 5,204,912 A * | 4/1993 | Schimanski | ....... | G01R 31/2808 348/126 |
| 5,446,672 A * | 8/1995 | Boldys | ............... | G05B 19/4184 700/174 |
| 6,909,927 B2 * | 6/2005 | Nguyen | ............. | G05B 23/0272 700/110 |
| 7,164,281 B2 * | 1/2007 | Kou | ................... | H05K 3/3415 324/750.3 |
| 7,533,459 B2 * | 5/2009 | Kano | ................... | H05K 13/08 29/832 |
| 7,593,780 B2 * | 9/2009 | Mann | ................... | G05B 19/042 700/17 |
| 7,725,200 B2 * | 5/2010 | Reed | ................... | G05B 19/4184 700/110 |
| 8,135,560 B2 * | 3/2012 | Schauer | ................ | C23C 14/505 702/145 |
| 8,255,072 B2 * | 8/2012 | Morisawa | ........... | C23C 16/4404 438/905 |
| 9,136,190 B2 * | 9/2015 | Okada | .............. | G05B 19/41865 |
| 9,613,329 B2 * | 4/2017 | Kamioka | ........... | G05B 23/0208 |

FOREIGN PATENT DOCUMENTS

| | | |
|---|---|---|
| JP | 2013-140906 A | 7/2013 |
| JP | 2013-207285 A | 10/2013 |

OTHER PUBLICATIONS

Extended European Search Report dated Nov. 22, 2017 in Patent Application No. 14908939.3.

* cited by examiner

BOARD WORK MANAGEMENT DEVICE

TECHNICAL FIELD

Technology disclosed herein relates to a management device for managing a board work quantity of a board work machine that performs work of mounting electronic components on a board.

BACKGROUND ART

Disclosed in patent literature 1 (JP-A-2004-165521) is a component mounting device (a type of board work machine) that performs specified work with respect to a circuit board. With this component mounting device, production result data such as quantity of production boards produced by the component mounting device, component pickup quantity, component pickup errors, and operating time is memorized on a memory. After production has been completed for a preset time period, production result data is extracted from the memory and an evaluation is performed of the operating state of the component mounting device. The component mounting device is provided with a means for resetting the production result data of the component mounting device at any given timing.

SUMMARY OF INVENTION

Problem To Be Solved

With the technology of patent literature 1, to reset the production result data of the component mounting device at any given timing, it is necessary to forcibly stop the component mounting device. As a result, resetting the production result data causes a problem of making the operating time of the component mounting device shorter.

Disclosed herein is a board work management device capable of resetting a board work quantity of a board work machine while the board work machine continues to operate.

Means for Solving the Problem

A board work management device disclosed herein manages a production line having multiple board work machines that produces electronic-component-mounted-boards on which electronic components are mounted by the multiple work machines each being set to perform specified work with respect to the board, with each of multiple of the boards being conveyed sequentially to each of the multiple board work machines, and each of the multiple board machines performing their respective work on each of the multiple boards. The board work management device includes: a board work quantity reset switch; a board work quantity counting section configured to count each board on which, from among the multiple board work machines, at least one board work machine has performed work, for each of the at least one board work machines; a board work quantity memory section configured to memorize the board work quantity of the board work machine counted by the board work quantity counting section; and a board work quantity resetting section configured to, when the board work quantity reset switch is operated, reset the board work quantity of a specified board work machine among the at least one board work machines memorized by the board work quantity memory section while the multiple board work machines are operating.

With the above board work management device, it is possible to reset the board work quantity of a specified board work machine by operating the board work quantity reset switch even when the multiple board work machines are operating. According to such a configuration, it is not necessary to stop the multiple board work machines to reset the board work quantity of the specified board work machine. As a result, it is possible to reset the board work quantity of the specified board work machine without lowering the operating time of the board work machine.

DESCRIPTION OF EMBODIMENTS

Figure 1:
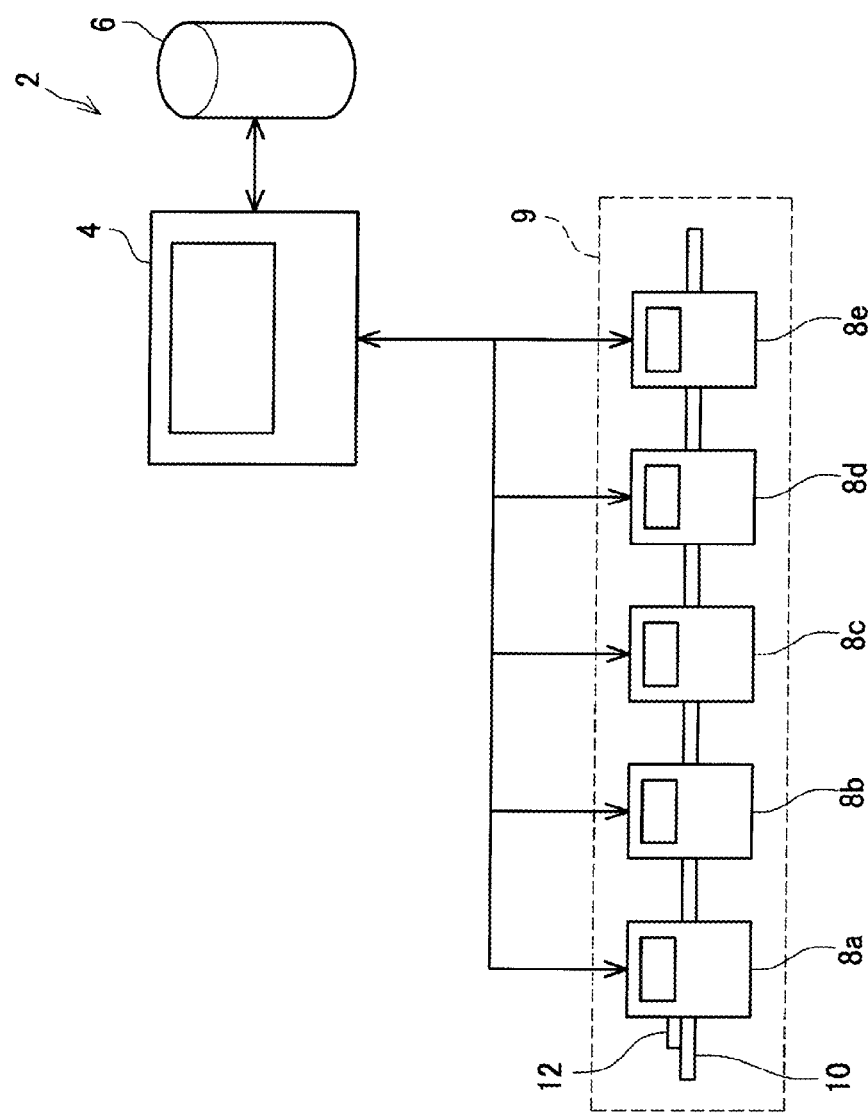
FIG. 1 is a block diagram showing the configuration of a board work management device.

The main features of embodiments are described below as examples of the disclosure. Note that, technical elements described in this specification and in the drawings exhibit technical utility alone or in various combinations, and are not limited to the combination of the described aspects of the application.

Feature 1

The board work quantity reset section, in a case in which the board work quantity reset switch is operated, when work is being performed on the board by a reference board work machine that is pre-selected from the multiple board work machines, may reset the board work quantity of the specified board work machine memorized by the board work quantity memory section when the board on which work is being performed by the reference board work machine is unloaded from the reference board work machine. With the above configuration, the board on which work is being performed by the board work machine that is the reference (the reference board work machine) when the reset switch is operated is counted as a board on which work was performed before the reset switch was operated. That is, boards loaded to the reference board work machine after the reset switch is operated are counted as boards on which work is performed after the reset switch was operated. Therefore, even in a case in which management is performed by resetting the board work quantity when work is completed with respect to the board by the reference board work machine, regardless of whether work has been performed on the board by the reference board work machine, it is possible to reset the board work quantity when work is completed with respect to the board by the reference board work machine just by operating the reset switch.

Feature 2

The board work quantity reset section, in a case in which the board work quantity reset switch is operated, may reset the board work quantity of the specified board work machine memorized by the board work quantity memory section when the board on which work is being performed by a board work machine that is furthest upstream among the multiple board work machines when the board work quantity reset switch is operated is unloaded from a board work machine that is further downstream from among the multiple board work machines. According to such a configuration, it is possible to appropriately distinguish between boards supplied to the production line (in detail, the furthest upstream board management device) up until the reset switch was operated and boards supplied to the production line after the reset switch was operated.

First Embodiment

An embodiment, board work management device 2, is described below. As shown in FIG. 1, board work management device 2 is for managing production line 9 that produces electronic-component-mounted-boards on which electronic components are mounted, and is provided with accessory PC 4 and data server 6. Production line 9 is configured from multiple board work machines 8a to 8e, and electronic-component-mounted-boards are produced by work being performed with respect to circuit board 12 by each board work machine 8a to 8e. Data server 6 is for memorizing electronic data, and is able to memorize a board work quantity of work performed by multiple board work machines 8a to 8e. Accessory PC 4 is connected to data server 6 and the multiple board work machines 8a to 8e such that communication is possible. Accessory PC 4 is used for processing of adding, checking, editing, and deleting electronic data memorized in data server 6, based on information sent from board work machine 8a to 8e.

First, production line 9 that board work management device 2 manages is described. The multiple board work machines 8a to 8e that configure production line 9 are arranged along conveyance path 10 in order from an upstream process to a downstream process. Circuit board 12 is consecutively conveyed along conveyance path 10 through the multiple board work machines 8a to 8e. The multiple board work machines 8a to 8e perform work set for each board work machine (for example, mounting of predetermined electronic components) with respect to circuit board 12. By this, an electronic-component-mounted-board on which electronic components are mounted is produced. Note that, the multiple board work machines 8a to 8e have the same configuration. Below, multiple board work machines 8a to 8e are referred to as "board work machine 8" when not distinguishing between individual machines.

Figure 2:
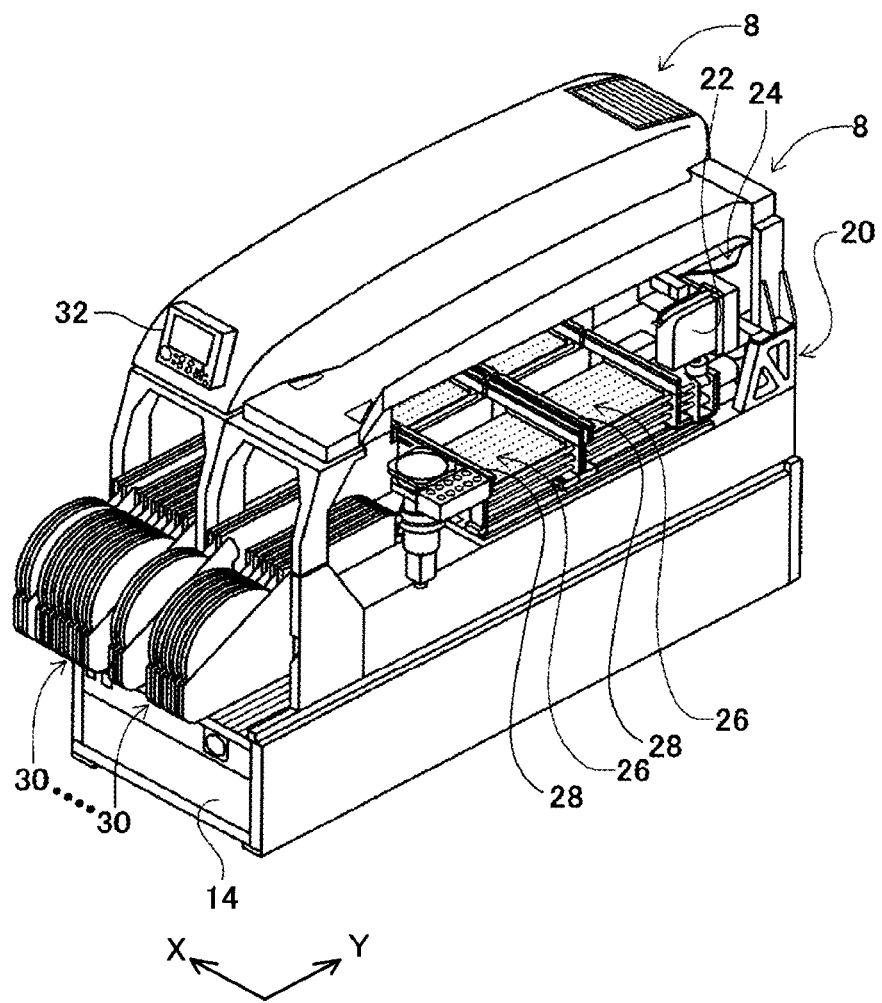
FIG. 2 shows a board work machine.

Board work machine 8 will be described with reference to FIGS. 2 and 3. Board work machine 8 is an example of a device that performs specified work on circuit board 12. As shown in FIG. 2, board work machine 8, along with other board work machines 8, is fixed to system base 14. In the descriptions below, the direction in FIG. 2 in which board work machines 8 are lined up is the X direction, the direction horizontally perpendicular to the X direction is the Y direction.

Board work machine 8 is provided with frame 20, and multiple feeders 30 fixed to frame 20. The multiple feeders 30 are removably attached to a front section of frame 20. Each feeder 30 stores multiple electronic components and supplies the electronic components to a mounting head, which is described later. Feeders 30 of the present embodiment are tape type feeders that store multiple electronic components in carrier tape. Note that, feeders 30 are not limited to tape type feeders, and may be other types of feeders. For example, feeders 30 may be tray type feeders that store multiple electronic components in a tray.

Board work machine 8 is provided with board support device 26 and board conveyance device 28. Board support device 26 and board conveyance device 28 are fixed to frame 20. Board support device 26 supports circuit board 12 on which electronic components are to be mounted. Board conveyance device 28 conveys circuit board 12 in the X direction, and loads the pre-work circuit board 12 to board support device 26, and unloads the post-work circuit board 12 from board support device 26. Board conveyance device 28 is connected in series to a board conveyance device 28 of another adjacent board work machine 8. Board conveyance device 28 receives circuit board 12 from a board work machine 8 adjacent in one direction, and sends the circuit board 12 on which mounting work of electronic components has been completed to a board work machine adjacent in the other direction. Note that, the specific configurations of board support device 26 and board conveyance device 28 are not particularly limited.

Board work machine 8 is provided with mounting head 22, and moving device 24 (XY robot) that moves mounting head 22 in the X direction and Y direction. Moving device 24 moves mounting head 22 in the X direction and Y direction. Mounting head 22 picks up and holds electronic components from feeder 30, transports the components, and mounts the components on circuit board 12 on board support device 26.

Board work machine 8 is provided with operation panel 32. Operation panel 32 receives instructions of an operator and displays various information to an operator. For example, the board work quantity of board work machine 8 is displayed on operation panel 32.

Figure 3:
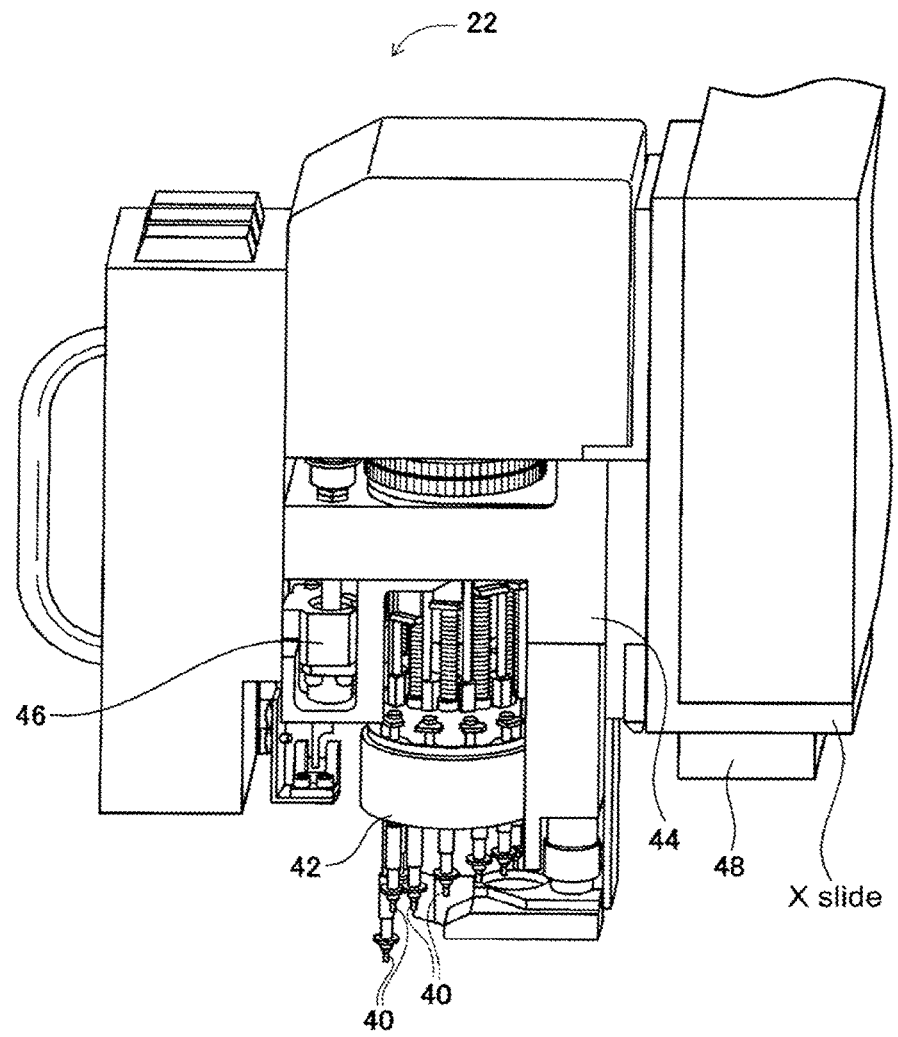
FIG. 3 shows a mounting head of a board work machine.

As shown in FIG. 3, mounting head 22 is provided with multiple nozzles 40, revolving device 42 that revolves the multiple nozzles, and raising and lowering device 46 that raises and lowers nozzles 40. Each nozzle 40 is a tool for picking up and releasing an electronic component, and mounting head 22 holds an electronic component on each nozzle 40. Revolving device 42 revolves the multiple nozzles 40 with respect to mounting head 22, and moves one suction nozzle selectively to a pickup position. Mounting head 22 picks up an electronic component from a feeder 30 by raising and lowering a nozzle 40 at the pickup position using raising and lowering device 46 and mounts the electronic component held by nozzle 40 on circuit board 12.

Board work machine 8 is provided with camera 48. Camera 48 is attached to a lower section of the X slide to which mounting head 22 is attached. Because the X slide is movable along with the mounting head in the X direction, camera 48 is moved in the X direction and Y direction by moving device 24. Camera 48 is arranged such that the light axis is facing approximately straight down, and is able to image feeder 30 or circuit board 12 loaded on board support device 26. Accordingly, camera 48 selectively images any position of circuit board 12 by moving relative to circuit board 12 in the X direction and Y direction. Operation of sections 30, 26, 22, 48 and so on of board work machine 8 is controlled by control device 50 (refer to FIG. 4) loaded on board work machine 8.

Figure 4:
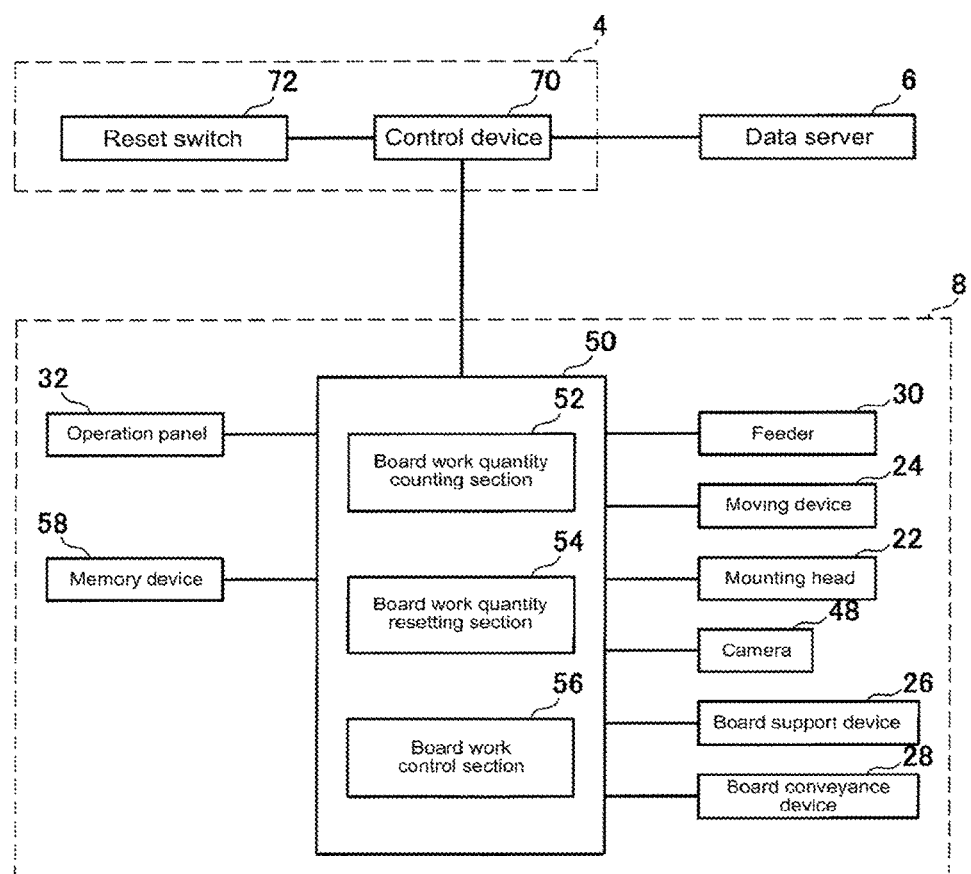
FIG. 4 shows the electrical configuration of the board work management device.

FIG. 4 is a block diagram showing the electrical configuration of board work management device 2. Accessory PC 4 is provided with control device 70 and reset switch 72 connected to control device 70. Control device 70 is configured from a computer provided with a CPU, ROM, and RAM. Control device 70 is connected to data server 6 and control device 50 of board work machine 8 such that communication is possible. Control device 70 performs processing of adding, checking, editing, and deleting data memorized on data server 6. Data memorized on data server 6 includes work information of work to be performed by board work machines 8a to 8e (for example, types and mounting positions of electronic components to be mounted), and work history data (for example, board work quantity, quantity of electronic component mounted). Board work machines 8a to 8e send work conditions of the respective board work machine 8 to control device 70, and control device 70 updates (adds to, edit, deletes from, and so on) the work history information in data server 6 based on work condition sent from board work machine 8a to 8e. Also, control device 70 sends a first reset signal to control device 50 when reset switch 72 is operated. Reset switch 72 can be operated at any time, for example, when an operator is changed, or when the type of circuit board 12 supplied to board work management device 2 is changed. That is, it is possible to perform resetting at a timing set freely by an administrator who manages production line 9 at a timing the administrator desires.

Board work machine 8 is provided with control device 50, and memorizing device 58 that is connected to control device 50 such that communication is possible. A calculating program for controlling operation of board work machine 8 and work history information such as a board work quantity of board work machine 8 and component usage quantity of feeder 30 are memorized on memorizing device 58. Control device 50, by performing a calculating program, functions as board work quantity counting section 52, board work quantity resetting section 54, and board work control section 56. Board work quantity counting section 52 counts the board work quantity of board work machine 8, which is the count of circuit boards 12 that are loaded to and unloaded from board conveyance device 28, and sends the counted board work quantity to operation panel 32, memorizing device 58, and data server 6. Board work quantity reset section 54, when reset switch 72 is operated and when specified predetermined conditions (described later) are satisfied, resets the board work quantity of board work machine 8 memorized by operation panel 32 and memorizing device 58. Board work control section 56, based on a calculating program memorized in memorizing device 58, controls operation of mounting head 22, moving device 24, board support device 26, board conveyance device 28, feeders 30, operation panel 32, and camera 48 so as to mount electronic components on circuit board 12. Control of each section 22, 24, 26, 28, 30, 32, and 48 by board work control section 56 is performed by well-known methods. Described below are board work quantity count processing performed by board work quantity counting section 52, and board work quantity reset processing performed by board work quantity resetting section 54.

First, board work quantity count processing performed by board work quantity counting section 52 of control section 50 is described. Board work quantity count processing is performed continuously. Board work quantity counting section 52 adds one to the board work quantity of a board work machine 8 when a circuit board 12 is unloaded from that board work machine 8. Whether a circuit board 12 has been unloaded from board work machine 8 may be determined by monitoring operation of board conveyance device 28 or by detecting unloading of a circuit board 12 from board support device 26 using camera 48 or a sensor (not shown in the figures). Board work machine 8 sends the new board work quantity to memorizing device 58, operation panel 32, and control device 70. Control device 70 updates the board work quantity of the board work machine memorized in a specified memory region of data server 6.

Figure 5:
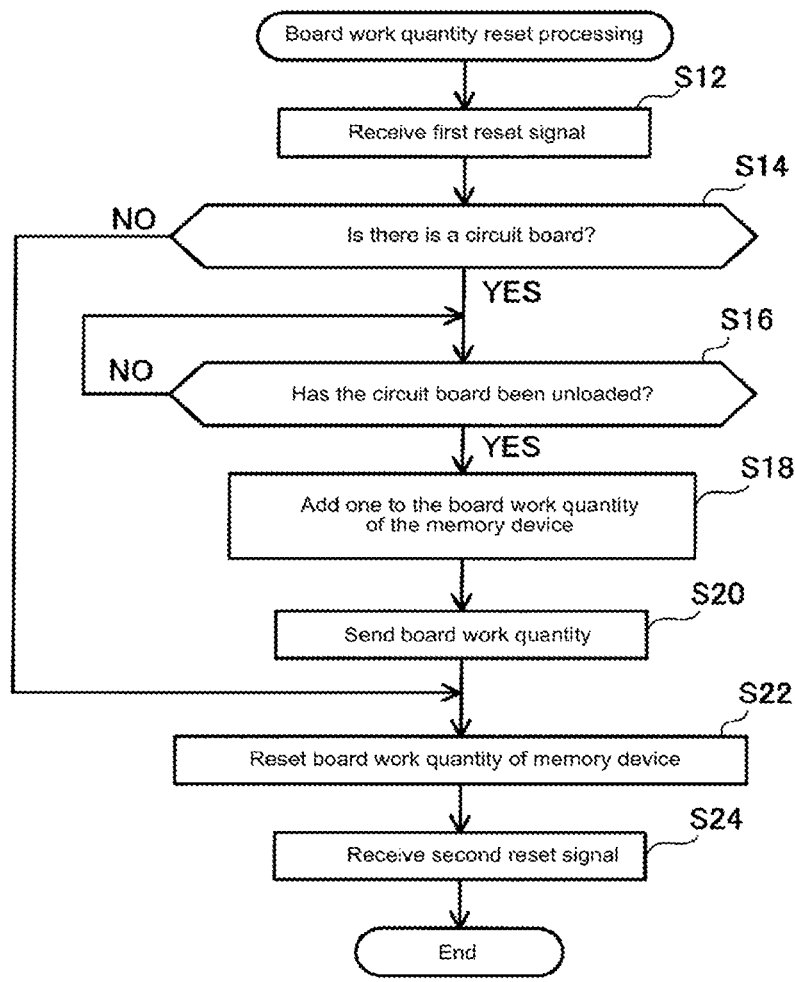
FIG. 5 shows a flowchart of board work quantity reset processing of a first embodiment.

Board work quantity reset processing is described next with reference to FIG. 5. Board work quantity reset processing is started by an operator operating reset switch 72.

Note that, before operating reset switch 72, the operator selects in advance the board work machine 8 for which to reset the board work quantity (hereinafter this is referred to as the reference board work machine). One, multiple, or all of the board work machines 8a to 8e may be selected.

First, control device 70, when reset switch 72 is operated, sends a first reset signal to control device 50 of the board work machine 8 selected as the reference board work machine. Control device 50 of the board work machine 8, when receiving the first reset signal sent from control device 70 (S12), performs processing of resetting the board work quantity of that board work machine. In a case in which there is a circuit board 12 in the board work machine upon receiving the first reset signal, control device 50 is set whether to count that circuit board 12 in the board work quantity prior to operation of the reset switch. In the present embodiment, control device 50 is set to count a circuit board 12 present in the board work machine when the first reset signal is received in the board work quantity prior to operation of the reset switch. Specified conditions for resetting are also set in control device 50. Specifically, in the present embodiment, control device 50 is set to reset the board work quantity after determining that a circuit board 12 has been unloaded from the board work machine 8 and adding that circuit board to the board work quantity. Therefore, if the first reset signal is received while the board work machine 8 is performing work on circuit board 12, control device 50 waits until work on the circuit board being performed at the time of receiving has been completed. Accordingly, control device 50, when receiving the first reset signal, first determines whether there is a circuit board 12 inside the board work machine 8 (S14). If there is a circuit board 12 inside the board work machine 8, for example, there are cases in which work is being performed on the circuit board 12 inside the board work machine 8. If work is being performed on circuit board 12, that is, it is determined that there is a circuit board 12 (S14 is yes), control device 50 monitors whether the circuit board 12 on which work was being performed at the time of receiving the first reset signal has been unloaded from board work machine 8 (S16). Then, when it is determined that the circuit board 12 has been unloaded from the board work machine 8 (S16 is yes), one is added to the board work quantity (S18), that new board work quantity is sent to control device 70 (S20), and then the board work quantity memorized in memorizing device 58 is reset (S22). Because the new board work quantity is sent to control device 70, the board work quantity of data server 6 is also renewed with one added to the count. On the other hand, if it is determined that there is no circuit board 12 inside board work machine 8 when the first reset signal is received (S14 is no) (that is, after a circuit board 12 has been unloaded and before another circuit board 12 has been loaded), control device 50 resets the board work quantity memorized on memorizing device 58 immediately (S22). By this, when reset switch 72 is operated, circuit boards 12 on which work is performed by the reference board work machine are counted as the board work quantity prior to operation of the reset switch. Also, control device 50 sends a second reset signal to control device 70 (S24) when the board work quantity memorized on memorizing device 58 is reset. Note that, when the board work quantity memorized on memorizing device 58 is reset, the board work quantity displayed on operation panel 32 is also reset.

As mentioned above, control device 50 sends a second reset signal to control device 70 when the board work quantity memorized on memorizing device 58 is reset. For this, control device 70 to which the first reset signal was sent monitors whether a second reset signal is received from the reference board work machine. Control device 70, when the second reset signal is received from the reference board work machine, updates the memory region of data server 6 in which the board work quantity of the reference board work machine is memorized. That is, the board work quantity at the time of receiving the second reset signal is saved, and the subsequent board work quantity is saved in a new region. By this, the board work quantity of work performed by the reference board work machine before reset switch 72 was operated is saved in data server 6. If two or greater board work machines 8 are selected to have the board work quantity reset, the above processing is performed for each of the board work machines.

As is clear from the above descriptions, with board work management device 2 of the present embodiment, because reset processing is performed after determining whether a circuit board 12 is inside the board work machine 8 based on the setting for whether a circuit board 12 present in the reference board work machine when reset switch 72 is operated is counted in the board work quantity prior to operation of reset switch 72, it is possible to reset the board work quantity of the reference board work machine while a board work machine 8 is operating. Also, in a case in which it is determined that a circuit board 12 is inside the reference board work machine, after it is determined that a specified condition of the circuit board 12 having been unloaded from the reference board work machine is satisfied, one is added to the board work quantity and then reset processing is performed. By this, it is possible to reset the board work quantity of the reference board work machine without lowering the operating time of board work management device 2. Also, when reset switch 72 is operated, if it is determined that there is a circuit board 12 inside the reference board work machine, the circuit board 12 is counted in the board work quantity prior to operation of the reset switch. Accordingly, it is possible to reset the board work quantity at a timing of the circuit board 12 being unloaded from the reference board work machine without adjusting the timing of reset switch 72.

Second Embodiment

Figure 6:
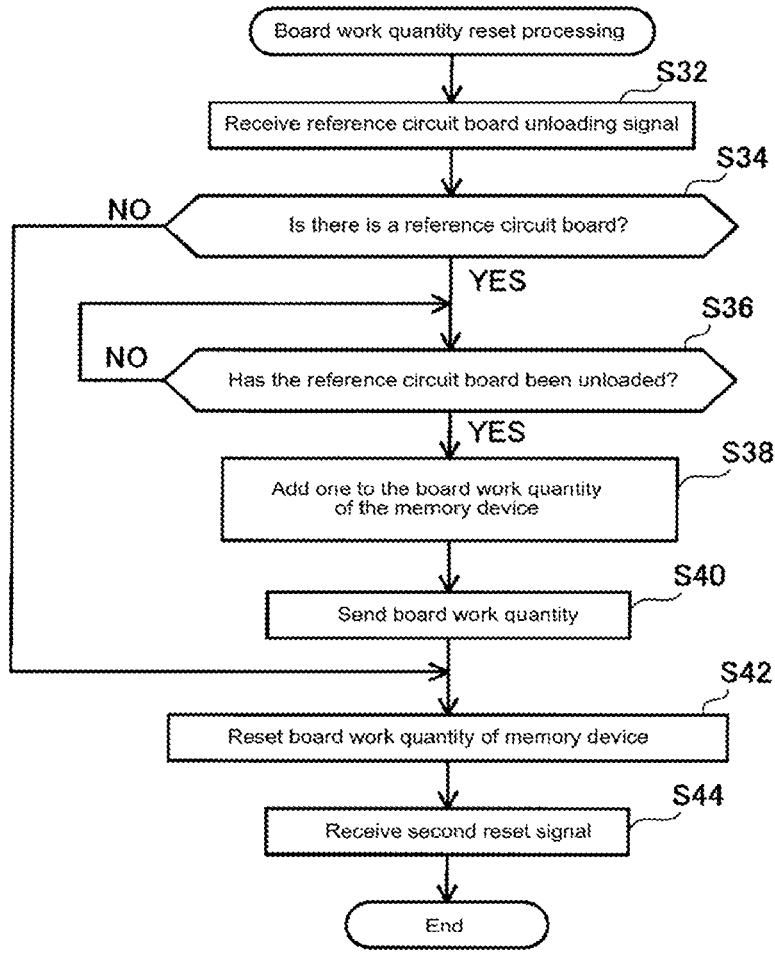
FIG. 6 shows a flowchart of board work quantity reset processing of a second embodiment.

Differences with the first embodiment will be described with reference to FIG. 6. Descriptions are omitted of configurations shared with the first embodiment. With the second embodiment, only board work quantity reset processing of board work quantity resetting section 54 is different to the first embodiment. Board work quantity reset processing is started by an operator operating reset switch 72. In the present embodiment, descriptions are given for resetting the board work quantity of board work machine 8e as the reference board work machine.

First, control device 70, when reset switch 72 is operated, sends a first reset signal to control device 50 of the board work machine 8a. In the present embodiment, the configuration is such that the board work quantity is reset when the circuit board 12 on which work was being performed at board work machine 8a, which is furthest upstream board work machine, when reset switch 72 was operated is unloaded from board work machine 8e, which is the furthest downstream board work machine. Therefore, first, control device 50 of board work machine 8a sets the circuit board 12 on which work was being performed by the board work machine 8a as a reference circuit board, and then monitors whether the reference circuit board has been unloaded from board work machine 8a. Then, when the reference circuit board is unloaded from board work machine 8a, control device 50 of board work machine 8a sends a reference circuit board unloaded signal to control device 50 of board work machine 8b via control device 70. Control device 50 of board work machine 8b monitors whether the reference circuit board has been unloaded from board work machine 8b, and when the reference circuit board has been unloaded, sends a reference circuit board unloaded signal to control device 50 of board work machine 8c via control device 70. Similar processing to board work machine 8b is performed for board work machines 8c and 8d. Note that, during board work quantity reset processing, the above board work quantity reset processing is performed when circuit boards 12 are unloaded from board work machine 8e. Then, control device 50 of board work machine 8e, upon receiving the reference circuit board unloading signal from control device 50 of board work machine 8d (S32), determines whether the reference circuit board is inside board work machine 8e (S34). When determining that the reference circuit board is present (S34 is yes), control device 50 of board work machine 8e monitors whether the reference circuit board has been unloaded from board work machine 8e (S36). Then, when it is determined that the reference circuit board has been unloaded from board work machine 8e (S36 is yes), one is added to the board work quantity (S38), that new board quantity is sent to control device 70 (S40), and then the board work quantity memorized in memorizing device 58 is reset (S42). Because the new board work quantity is sent to control device 70, the board work quantity of data server 6 is also renewed with one added to the count. Also, control device 50 sends a second reset signal to control device 70 (S44) when the board work quantity memorized on memorizing device 58 is reset. Note that, when the board work quantity memorized on memorizing device 58 is reset, the board work quantity displayed on operation panel 32 is also reset.

As is clear from the above descriptions, control device 50 of board work machine 8e sends a second reset signal to control device 70 when the board work quantity memorized on memorizing device 58 is reset. For this, control device 70 to which the first reset signal was sent monitors whether a second reset signal is received from board work machine 8e. Control device 70, when the second reset signal is received from board work machine 8e, updates the memory region of data server 6 in which the board work quantity of board work machine 8e is memorized. That is, the board work quantity at the time of receiving the second reset signal is saved, and the subsequent board work quantity is saved in a new region. By this, the quantity of circuit boards 12 supplied to production line 9 up to the point when reset switch 72 was operated is saved in data server 6. In the present embodiment, only the board work quantity of board work machine 8e is reset, but the board work quantity of multiple board work machines 8 may be reset.

According to the above configuration, for example, because reset processing is performed after determining whether a reference circuit board is present inside a board work machine (in the present embodiment, board work machine 8e) for which the board work quantity is to be reset based on the setting for whether a circuit board 12 present in board work machine 8a, which is furthest upstream, when reset switch 72 was operated is counted in the board work quantity prior to operation of reset switch 72, it is possible to appropriately distinguish between circuit boards 12 supplied to production line 9 up to the time when reset switch 72 was operated, and circuit boards 12 supplied to production line 9 after reset switch 72 was operated, while a board work machines 8 is operating.

The above describes details of specific examples of the technology of this disclosure, but these are only examples and in no way restrict the claims of the invention. The technology disclosed in the claims include various changes and modifications to the specific examples illustrated above.

Alternative Embodiment 1

For example, in the above embodiments, accessory PC 4 has reset switch 72. However, board work machine 8 may have reset switch 72.

Alternative Embodiment 2

In an embodiment above, board work management device 2 is set to reset the board work quantity when the circuit board 12 on which work is being performed by the reference board work machine when reset switch 72 is operated is unloaded from the reference board work machine. However, the board work quantity may be reset while work is being performed on the circuit board 12 by the reference board work machine.

Alternative Embodiment 3

In an embodiment above, descriptions are given based on multiple board work machines 8a to 8e with the same configuration. However, so long as the multiple board work machines 8a to 8e each perform set work with respect to circuit board 12, they may include a board work machine with a different configuration. Also, work set for each board work machine is not limited to mounting of electronic components. For example, work set for each board work machine may be work such as printing of solder paste on a circuit board, inspection of a printing condition of solder paste printed on a circuit board, or inspection of a mounting state of electronic components mounted on a circuit board.

Alternative Embodiment 4

In an embodiment above, board work quantity counting section 52 counts the board work quantity of a board work machine based on the unloading of a circuit board 12. And, board work management device 2 is set to determine whether a circuit board 12 is present inside a reference board work machine, and when determining that a circuit board 12 is present, reset the board work quantity when the circuit board 12 is unloaded from the reference board work machine. However, board work management device 2 may be set to, instead of determining whether the circuit board 12 has been unloaded from the reference board work machine, determine whether the work set to be performed by the reference board work machine has been performed, and when determining that the work set to be performed by the reference board work machine has been performed, add one to the board work quantity and then reset the board work quantity. As a case in which the circuit board 12 is not unloaded from the reference board work machine even though the reference board work machine has finished work with respect to the circuit board 12, for example, there are cases in which the reference board work machine stands by until a work machine downstream to the reference board work machine is in a state in which the circuit board 12 can be loaded. With such a board work management device 2 too, because reset processing is performed after determining whether a circuit board 12 is inside the board work machine 8 based on the setting for whether a circuit board 12 present in the reference board work machine when reset switch 72 is operated is counted in the board work quantity prior to operation of reset switch 72, it is possible to reset the board work quantity of the reference board work machine while a board work machine 8 is operating. Also, in a case in which it is determined that a circuit board 12 is inside the reference board work machine, reset processing is performed after it is determined that a specified condition of the work set for the reference board work machine being complete is satisfied. By this, it is possible to reset the board work quantity of the reference board work machine without lowering the operating time of board work management device 2.

Alternative Embodiment 5

Figure 7:
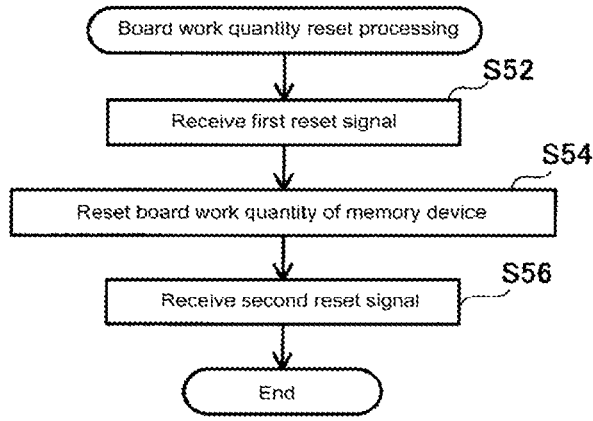
FIG. 7 shows a flowchart of board work quantity reset processing of an alternative (5) embodiment.

In an embodiment above, board work management device 2 is set to count a circuit board 12 present in the reference board work machine when reset switch 72 is operated in the board work quantity prior to operation of reset switch 72. However, board work management device 2 may be set not to count a circuit board 12 present in the reference board work machine when reset switch 72 is operated in the board work quantity prior to operation of reset switch 72. For example, as shown in FIG. 7, control device 50 of the reference board work machine may, upon receiving a first reset signal sent from control device 70 (S52), reset the board work quantity memorized in memorizing device 58 (S54) without determining whether a circuit board 12 is present in the reference board work machine. That is, the board work quantity memorized in memorizing device 58 when reset switch 72 is operated may be reset. Then, control device 50 may send a second reset signal to control device 70 (S56). Control device 70, when the second reset signal is received from the reference board work machine, updates the memory region of data server 6 in which the board work quantity of the reference board work machine is memorized. With such a board work management device 2 too, because reset processing is performed based on the setting to not count a circuit board 12 present in the reference board work machine when reset switch 72 is operated in the board work quantity prior to operation of reset switch 72, it is possible to reset the board work quantity of the reference board work machine while a board work machine 8 is operating.

Technical elements described in this specification and in the drawings exhibit technical utility alone or in various combinations, and are not limited to the combination of the described aspects of the application. Also, the examples of the techniques in this specification and the figures achieve multiple purposes at the same time, but also exhibit technical utility when achieving one among those purposes.

The invention claimed is:

1. A board work management device for managing a production line that produces electronic-component-mounted-boards on which electronic components are mounted by multiple work machines each being set to perform specified work with respect to the board, with each of multiple boards conveyed sequentially to each of the multiple board work machines, and each of the multiple board work machines performing their respective work on each of the multiple boards, the board work management device comprising:

a first control device which includes a board work quantity reset switch; and a second control device connected to the first control device, the second control device including a board work quantity counting section configured to count each board of the multiple boards on which, from among the multiple board work machines, at least one board work machine has performed work, for each of the at least one board work machines;

a board work quantity memory section configured to memorize the board work quantity of the board work machine counted by the board work quantity counting section; and a board work quantity resetting section configured to, when the board work quantity reset switch is operated, reset the board work quantity of a specified board work machine among the at least one board work machines memorized by the board work quantity memory section while the multiple board work machines are operating, wherein the second control device sends the board work quantity of the specified board work machine to the first control device in response to the board work quantity reset switch is operated and prior to being reset by the board work quantity resetting section.

2. The board work management device according to claim 1, wherein the board work quantity resetting section, when the board work quantity reset switch is operated and work is being performed on a board of the multiple boards by the specified board work machine, resets the board work quantity of the specified board work machine when the board is unloaded from the specified board work machine.

3. The board work management device according to claim 1, wherein the board work quantity resetting section, when the board work quantity reset switch is operated and work is being performed on a board of the multiple boards by a board work machine that is furthest upstream among the multiple board work machines, resets the board work quantity of the specified board work machine when the board is unloaded from a board work machine that is furthest downstream from among the multiple board work machines.

* * * * *